United States Patent
Fukui

(10) Patent No.: US 7,304,509 B2
(45) Date of Patent: Dec. 4, 2007

(54) IMPEDANCE CIRCUIT, POWER SUPPLY DEVICE

(75) Inventor: Yutaka Fukui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 45 days.

(21) Appl. No.: 11/341,595

(22) Filed: Jan. 30, 2006

(65) Prior Publication Data

US 2007/0103187 A1 May 10, 2007

(30) Foreign Application Priority Data

Oct. 31, 2005  (JP)  .............................. 2005-316859

(51) Int. Cl.
*H03K 19/10* (2006.01)
*H03K 19/20* (2006.01)
*H03K 19/02* (2006.01)

(52) U.S. Cl. ....................................... 326/134; 326/135

(58) Field of Classification Search ......... 326/134–135
See application file for complete search history.

(56) References Cited

U.S. PATENT DOCUMENTS

| | | | |
|---|---|---|---|
| 3,987,381 A * | 10/1976 | Szechenyi | .................... 333/217 |
| 4,015,190 A * | 3/1977 | Gasser et al. | ................ 323/268 |
| 6,046,461 A | 4/2000 | Saitoh et al. | |
| 6,456,174 B1 | 9/2002 | Kawai | |
| 6,459,247 B1 | 10/2002 | Benes | |

2003/0030485 A1  2/2003  Pobanz et al.

FOREIGN PATENT DOCUMENTS

| | | |
|---|---|---|
| GB | 1368391 | 9/1974 |
| GB | 1476907 | 6/1977 |
| GB | 1476907 A * | 9/1983 |
| JP | 9-321548 | 12/1997 |
| SU | 993438 | 1/1983 |

OTHER PUBLICATIONS

Agilent Technologies Inc., USA, "Mobile Communications dc Sources," Product Overview, pp. 1-16, May 1, 2004.
Extended European Search Report issued Mar. 19, 2007 in corresponding European Patent Application No. 06250341.2-2215.

* cited by examiner

*Primary Examiner*—Rexford Barnie
*Assistant Examiner*—Jason Crawford
(74) *Attorney, Agent, or Firm*—Staas & Halsey LLP

(57) ABSTRACT

There is disclosed an impedance circuit which realizes negative impedance with ease, and a power supply device having negative output impedance. An impedance circuit 1 connected to an external circuit comprises: a current inverter circuit 11 having an input terminal connected to outside; a passive circuit 10 having an input terminal connected to an output terminal of the current inverter circuit 11; and a current inverter circuit 12 having an input terminal connected to an output terminal of the passive circuit 10 and an output terminal connected to outside. The current inverter circuits 11 and 12 work in cooperation with each other, to make magnitude of impedance of the impedance circuit 1 proportional to impedance of the passive circuit 10, and to invert the polarity of the impedance of the impedance circuit 1.

6 Claims, 5 Drawing Sheets

IMPEDANCE CIRCUIT, POWER SUPPLY DEVICE

BACKGROUND OF THE INVENTION

1. Field of the Invention

The present invention relates to an impedance circuit having negative impedance.

2. Description of the Related Art

There have been demands for an impedance circuit having negative impedance. Particularly, a one-port circuit capable of varying resistance values from a negative resistance to a positive resistance. This one-port circuit cannot be a passive circuit constituted only by passive elements but has to be an active circuit including active elements such as transistors, FETs, and the like.

An example where negative impedance is required Will now be described.

In case of supplying electric power to a load from a direct current power supply, the potential difference between both ends of a load is requested to be maintained constant under a condition that the load current varies. If a direct current power supply having a remote sensing function is used in this case, the potential difference at the portion (sensing point) to which a sensing pair wire as a pair wire of a power supply for sensing is connected can be controlled accurately.

FIG. 8 is a circuit diagram showing an example of a power supply device having the remote sensing function. This direct current power supply device has a power supply section 101, a load 102, a resistor 103 which represents the resistance of a current path between a power supply and a sensing point, and a resistor 104 which represents another current path between the sensing point and the load. The resistance value of the resistor 103 is RL1. The resistance value of the resistor 104 is RL2. The current flowing through the resistor 104 is I load.

In this kind of power supply device, the output of the power supply sometimes causes an oscillation phenomenon when remote sensing is carried out. Furthermore, the sensing pair wire cannot always be connected near the load due to some reasons, such as mechanical interferences and physical limitations. In those cases, a voltage drop occurs due to the resistance RL2 which the current path between the sensing point and the load as shown in FIG. 8 has.

If the above-mentioned voltage drop caused between the sensing point and the load can be compensated, the voltage between the both ends of the load can be maintained constant. Accordingly, the problem as described above can be solved.

There also have been demands for a power supply which simulates a battery. For example, in a device which works with electric power supplied from a battery, test items concerning interactions between the device and the battery have been requested to be properly carried out before shipping.

Performance of a battery which works based on electrochemical effects deteriorates gradually as charging and discharging are repeated. Another factor causing deterioration in performance is repetition of a temperature cycle. Deterioration in performance based on aging of a battery built in a device appears as an increase in internal resistance of the battery. To become a power supply capable of simulating these characteristics of a battery, the power supply has to have an output resistance characteristic and a voltage characteristic substantially corresponding to the characteristic of a battery. If tests can be carried out using a power supply in place of a battery, data concerning a device to be tested can be accurately collected under critical operating conditions.

For example, in case of a battery of a cellular phone, a large current flows out of the battery when the cellular phone transmit. Consequently, the voltage of the battery lowers. At this time, if the voltage of the battery decreases lower than a lower limit of guaranteed operating conditions, the transmission is interrupted. Further, due to aging of the battery, the internal resistance of the battery increases and the voltage of the battery decreases at the time of outputting a large current. This increases the frequency at which transmission is interrupted.

Thus, the output resistance value of the power supply is requested to be varied smoothly, in order to simulate the internal resistance of a battery.

For example, the U.S. Pat. No. 6,459,247 has been known as a conventional technique relevant to the present invention. According to this patent document, a power supply having negative output resistance can be realized.

If a power supply having negative output resistance as disclosed in the above patent document is available, the voltage between two ends of a load can be maintained constant by compensating for a voltage drop caused between the sensing pair wire and the load as described above. This kind of power supply is expensive and has not yet been prevailing very much.

SUMMARY OF THE INVENTION

The present invention has been made to solve problems described above, and has an object of providing an impedance circuit capable of realizing negative impedance with ease.

To solve the above problems, an impedance circuit according to an aspect of the present invention is connected to an external circuit and comprises: a first current inverter circuit having an input terminal connected to outside; a passive circuit having an input terminal connected to an output terminal of the first current inverter circuit; and a second current inverter circuit having an input terminal connected to an output terminal of the passive circuit and an output terminal connected to outside, wherein the first and second current inverter circuits work in cooperation with each other, to make magnitude of impedance of the impedance circuit proportional to impedance of the passive circuit, and to invert a polarity of the impedance of the impedance circuit.

In the impedance circuit according to the present invention, the second current inverter circuit has a current amplification factor which is a reciprocal of a current amplification factor of the first current inverter circuit.

In the impedance circuit according to the present invention, the first and second current inverter circuits each have one operational amplifier, a resistor connected between an output terminal of the operational amplifier and a non-inverted input terminal thereof, and a resistor connected between the output terminal of the operational amplifier and an inverted input terminal thereof.

In the impedance circuit according to the present invention, the first and second current inverter circuits each have one operational amplifier, two diodes connected in inverse-parallel to each other between an output terminal of the operational amplifier and a non-inverted input terminal thereof, and two diodes connected in inverse-parallel to each other between the output terminal of the operational amplifier and an inverted input terminal thereof.

A power supply device according to another aspect of the present invention comprises: a power supply section which supplies direct current power supply; and an impedance circuit which is connected between the power supply section and an external load, has a first current inverter circuit, a passive circuit, and a second current inverter circuit, and has negative impedance that compensates for impedance of a path between the power supply section and the external load.

In the power supply device according to the present invention, the first current inverter circuit has an input terminal connected to the power supply section, the passive circuit has an input terminal connected to an output terminal of the first current inverter circuit, and the second current inverter circuit has an input terminal connected to an output terminal of the passive circuit and an output terminal connected to the external load, and the first and second current inverter circuits work in cooperation with each other, to make magnitude of impedance of the impedance circuit proportional to impedance of the passive circuit, and to invert a polarity of the impedance of the impedance circuit.

In the power supply device according to the present invention, the second current inverter circuit has a current amplification factor which is a reciprocal of a current amplification factor of the first current inverter circuit.

In the power supply device according to the present invention, the first and second current inverter circuits each have one operational amplifier, a resistor connected between an output terminal of the operational amplifier and a non-inverted input terminal thereof, and a resistor connected between the output terminal of the operational amplifier and an inverted input terminal thereof.

In the power supply device according to the present invention, the first and second current inverter circuits each have one operational amplifier, two diodes connected in inverse-parallel to each other between an output terminal of the operational amplifier and a non-inverted input terminal thereof, and two diodes connected in inverse-parallel to each other between the output terminal of the operational amplifier and an inverted input terminal thereof.

According to the present invention, negative impedance can be realized with ease. Further, the negative impedance can be used for compensation for a voltage drop.

DETAILED DESCRIPTION OF THE PREFERRED EMBODIMENTS

Hereinafter, embodiments of the present invention will be described with reference to the drawings.

First Embodiment

In this embodiment, an impedance circuit using a current inverter circuit will be described.

Figure 1:
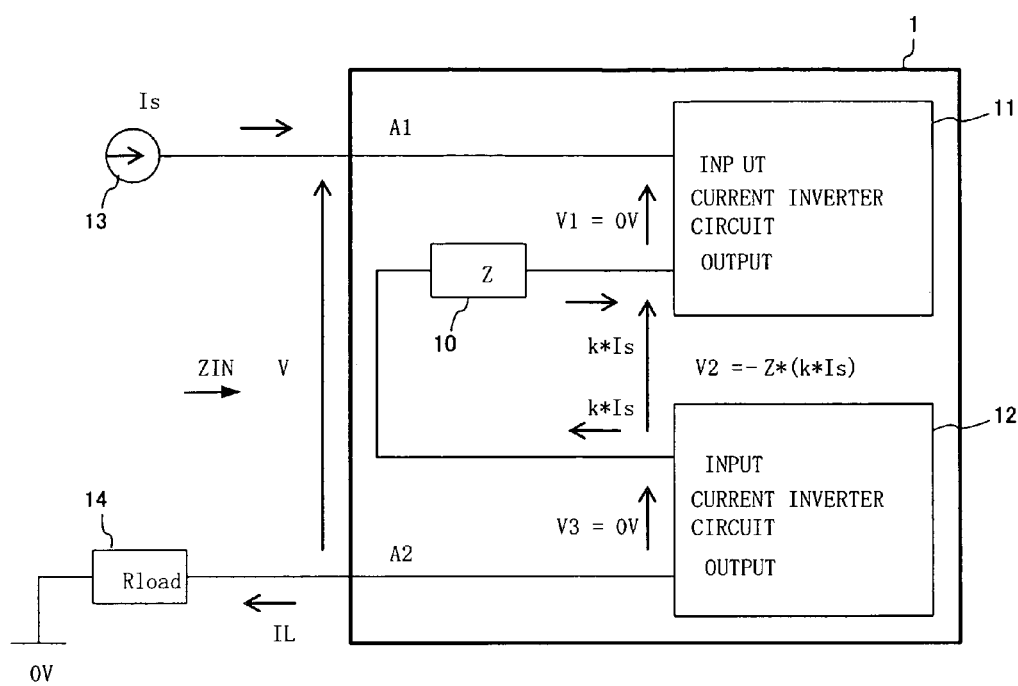
FIG. 1 is a circuit diagram showing an example of the structure of a negative impedance circuit according to the present invention.

The structure of an impedance circuit according to the present invention will now be described first. FIG. 1 is a circuit diagram showing an example of the structure of the impedance circuit according to the present invention. This impedance circuit 1 has a passive circuit 10, and current inverter circuits 11 and 12. An input terminal of the impedance circuit 1 is denoted as A1, and an output terminal thereof is denoted as A2.

The input terminal of the current inverter circuit 11 is connected to an external current source 13 through A1. An output terminal of the current inverter circuit 11 is connected to an input terminal of the passive circuit 10. An input terminal of the current inverter circuit 12 is connected to an output terminal of the passive circuit 10. An output terminal of the current inverter circuit 12 is connected to an external load 14 through A2. The current inverter circuits each are a circuit which extracts a current output having an inverted polarity of an input signal current.

Now suppose that the impedance of the passive circuit 10 is Z, the signal current flowing out of a current source 13 is Is, the resistance value of the load 14 is Rload, and the current flowing through the load 14 is IL. A potential difference between the terminals of current inverter circuit 11 is V1. Another potential difference between the terminals of the passive circuit 10 is V2. Further another potential difference between the terminals of the current inverter circuit 12 is V3. Still another potential difference between the terminals A1 and A2 of the impedance circuit 1 is V. Input impedance of the impedance circuit 1 is ZIN.

The current inverter circuit 11 will be described next.

Figure 2:
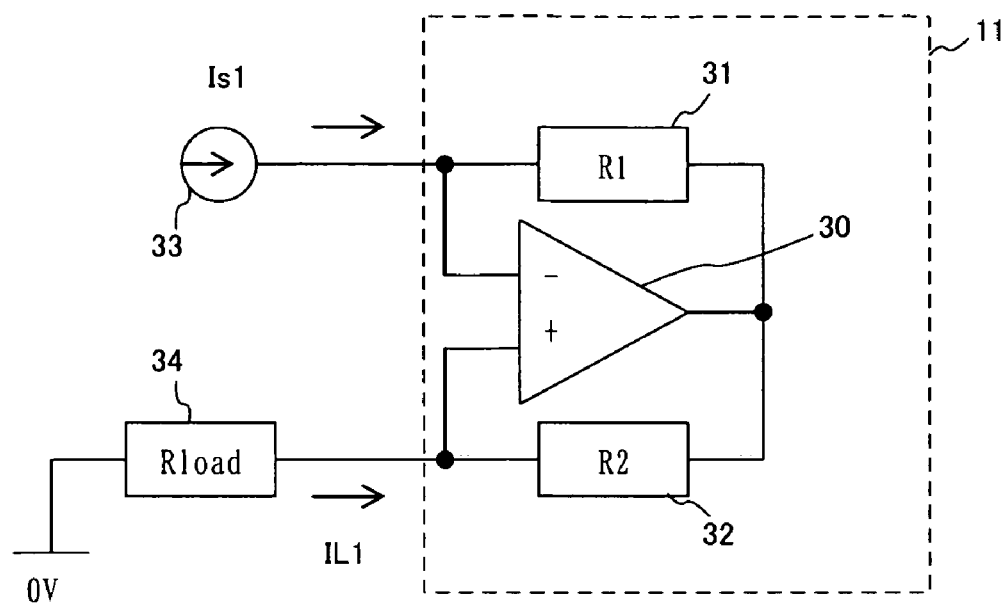
FIG. 2 is a circuit diagram showing a first example of the structure of a current inverter circuit according to the present invention.

FIG. 2 is a circuit diagram showing a first example of the structure of the current inverter circuit according to the present invention. This current inverter circuit 11 has one operational amplifier 30 and two resistors 31 and 32. Resistance values of the resistors 31 and 32 are respectively R1 and R2. This example shows a case where a current source 33 is connected to an input terminal of the current inverter circuit 11 and a load 34 is connected to an output terminal of the current inverter circuit 11. A current flowing into the current inverter circuit 11 from the current source 33 is Is1, and another current flowing into the current inverter circuit 11 from the load 34 is IL1.

A voltage drop caused by a flow of the signal current Is1 through the resistor 31 is equal to another voltage drop caused by a flow of the load current IL1 through the resistor 32. IL1 in FIG. 2 is obtained by the following expression.

$$IL1=(R1/R2)*Is1=Is1$$

That is, the current inverter circuit 11 has a current amplification factor $k=R1/R2$ The current inverter circuit 12 will be described next.

Figure 3:
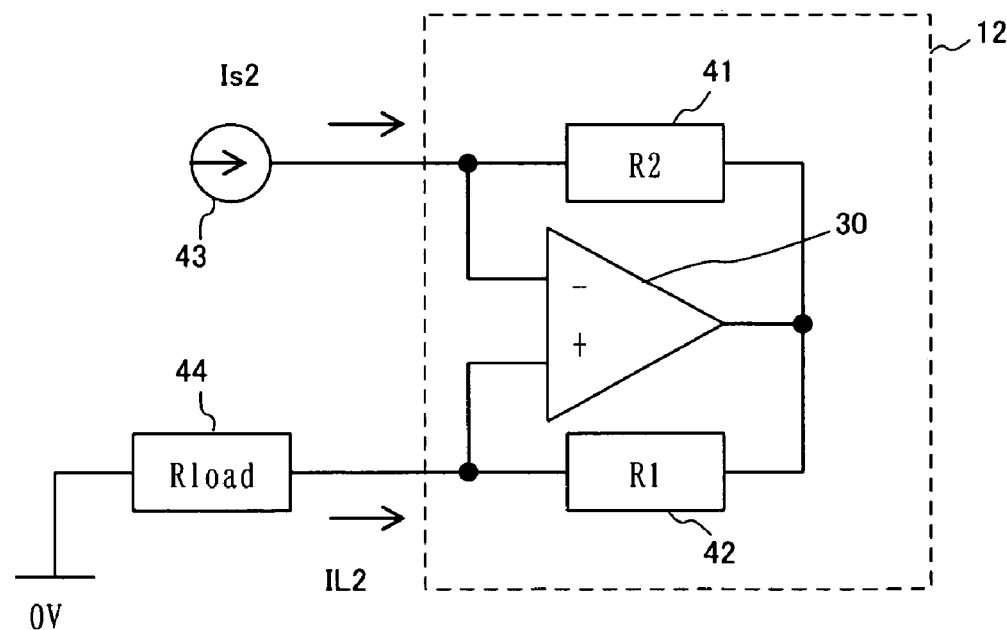
FIG. 3 is a circuit diagram showing a second example of the structure of the current inverter circuit according to the present invention.

FIG. 3 is a circuit diagram showing a second example of the structure of the current inverter circuit according to the present invention. This current inverter circuit 12 has one operational amplifier 30 and two resistors 41 and 42. Resistance values of the resistors 41 and 42 are respectively R2 and R1. This example shows a case where a current source 43 is connected to an input terminal of the current inverter circuit 12 and a load 44 is connected to an output terminal of the current inverter circuit 12. A current flowing into the current inverter circuit 12 from the current source 43 is Is2, and another current flowing into the current inverter circuit 12 from the load 44 is IL2. Like in the case of FIG. 2, IL2 in FIG. 3 is obtained by the following expression.

$$IL2=(R2/R1)*Is2=(1/k)*Is2$$

That is, the current inverter circuit 12 has a current amplification factor 1/K=R2/R1.

Input impedance of the impedance circuit 1 will be described next.

In the impedance circuit 1, the amplitude of a current flowing into the current inverter circuit 11 from the passive circuit 10 is k*Is. Therefore, a current of the same amplitude flows into the passive circuit 10 from the current inverter circuit 12. Accordingly, the current IL flowing into the load 14 is obtained by the following expression.

$$IL=(1/k)*k*Is=Is$$

In this case, V1=0 and V3=0 are given. Due to the relationship between Is1 and IL1 as described above, the current flowing through the passive circuit 10 is given by k*Is. Therefore, the potential difference V between the terminals A1 and A2 of the impedance circuit 1 is obtained by the following expression.

$$\begin{aligned} V &= V1 + V2 + V3 \\ &= 0 - Z*(k*Is) + 0 \\ &= -k*Z*Is \end{aligned}$$

This means that a voltage rise of k*Z*Is is caused in the impedance circuit 1. Input impedance ZIN of the impedance circuit 1 is obtained by the following expression.

$$ZIN=V/Is=-k*Z$$

Negative impedance is thus realized in the impedance circuit 1, as will be understood.

The passive circuit 10 may be either a passive element or a passive element network which has a fixed circuit value, such as a resistor, capacitor, coil, diode, or the like. Alternatively, the passive circuit 10 may be either a passive element or a passive element network whose circuit value is variable and is mechanically or electronically controllable, such as a resistor element (volume), variable capacitance element (e.g., a variable condenser or a varicap), or the like.

According to the present embodiment, negative impedance can be realized with a simple structure at a low price.

Second Embodiment

In the present embodiment, an impedance circuit using another current inverter circuit will be described.

Figure 4:
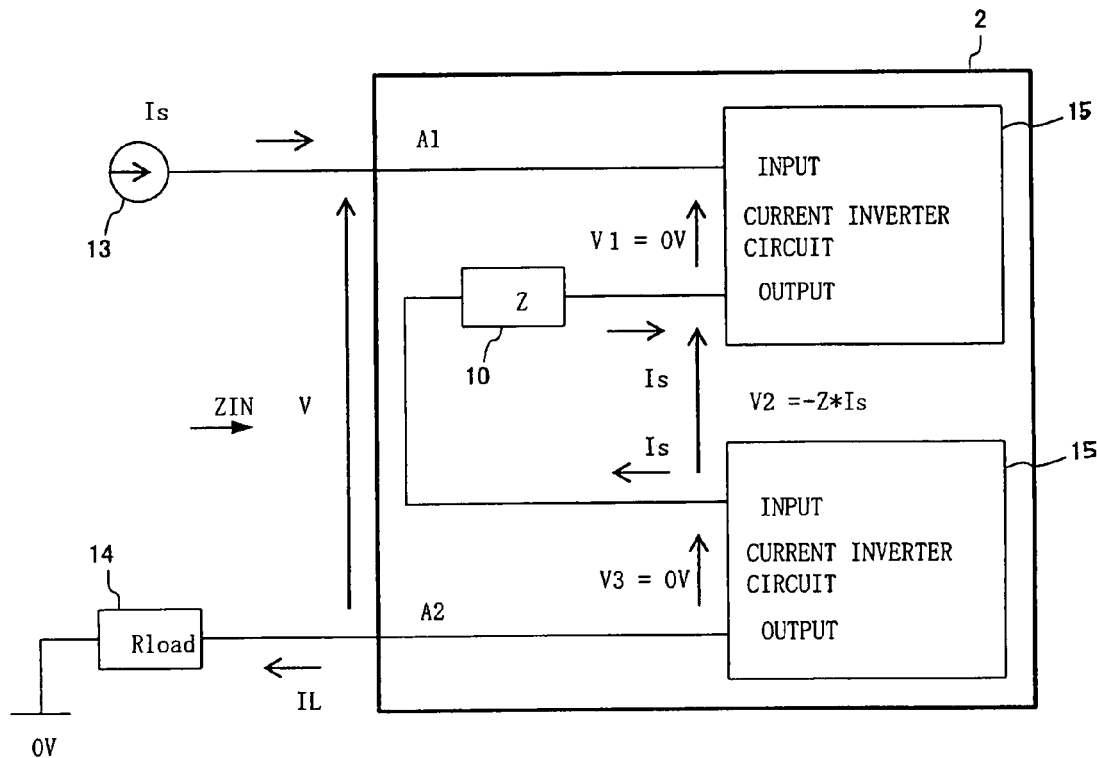
FIG. 4 is a circuit diagram showing another example of the structure of the negative impedance circuit according to the present invention.

FIG. 4 is a circuit diagram showing another example of the structure of the impedance circuit according to the present invention. In FIG. 4, the same reference symbols as those of FIG. 1 denote identical or equivalent components to those shown in FIG. 1. Descriptions thereof will be omitted herefrom. Compared with FIG. 1, an impedance circuit 2 in place of the impedance circuit 1 is included in FIG. 3. Compared with the impedance circuit 1, the impedance circuit 2 has two current inverter circuits 15 in place of the current inverter circuits 11 and 12.

The current inverter circuits 15 will be described next.

Figure 5:
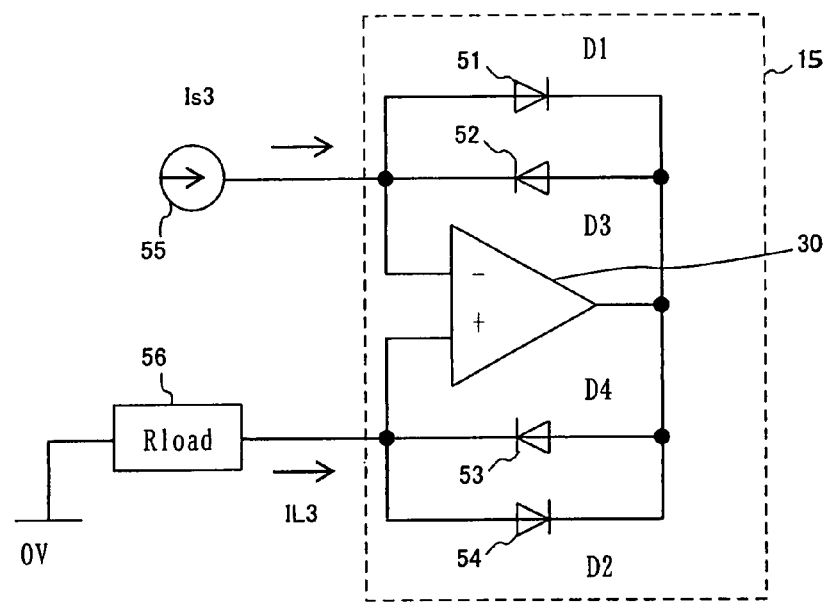
FIG. 5 is a circuit diagram showing a third example of the structure of the current inverter circuit according to the present invention.

FIG. 5 is a circuit diagram showing a third example of the structure of the current inverter circuit according to the present invention. In FIG. 5, the same reference symbols as those of FIG. 2 denote identical or equivalent components to those shown in FIG. 2. Descriptions thereof will be omitted herefrom. Compared with FIG. 2, FIG. 5 includes diodes 51 and 52 connected in inverse-parallel to each other, in place of the resistor 31 and diodes 53 and 54 connected in inverse-parallel to each other, in place of the resistor 32. This example shows a case where a current source 55 is connected to an input terminal of the current inverter circuit 15 and a load 56 is connected to an output terminal of the current inverter circuit 15. A current flowing from the current source 55 into the current inverter circuit 13 is Is3, and another current flowing from the load 56 into the current inverter circuit 15 is Il3. Il3 in FIG. 5 is obtained by the following expression.

$$IL3=Is3$$

Hence, IL, V, and ZIN concerning the impedance circuit 2 in FIG. 4 are obtained by the following expression, like in the first embodiment.

$$IL=Is$$

$$V=-Z*Is$$

$$ZIN=V/Is=-Z$$

Negative impedance can thus be realized by the impedance circuit 2, as will be understood.

According to the present embodiment, a current inverter circuit having a wide dynamic range relative to currents can be realized if excellent matching is achieved among diodes 51, 52, 53 and 54.

Third Embodiment

In the present embodiment, a power supply device using an impedance circuit described above will be described.

Figure 6:
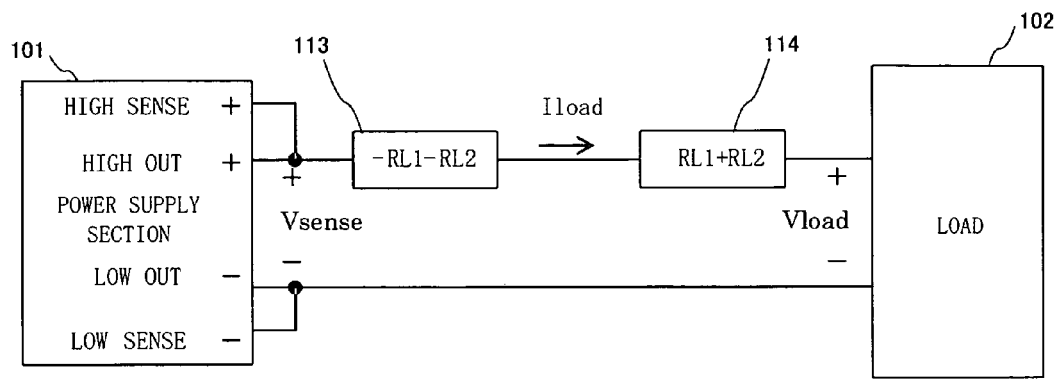
FIG. 6 is a circuit diagram showing an example of the structure of a power supply device using a negative impedance circuit according to the present invention.
Figure 8:
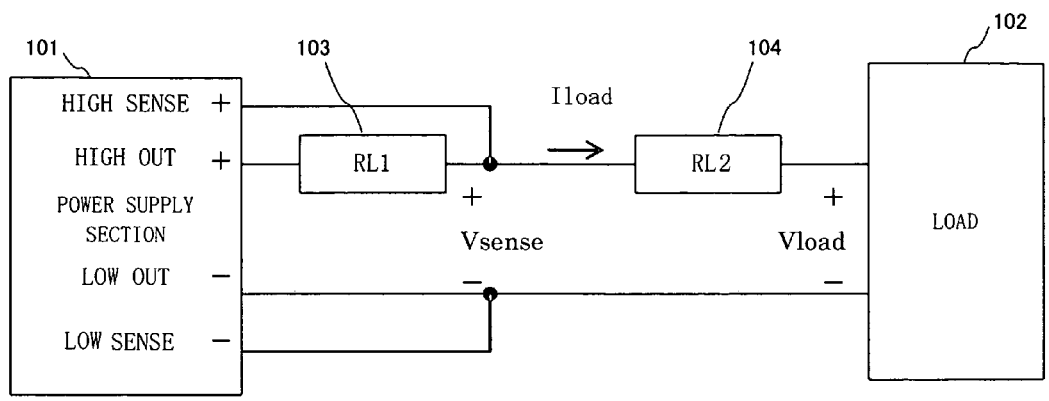
FIG. 8 is a circuit diagram showing an example of the structure of a power supply device having a remote sensing function.

FIG. 6 is a circuit diagram showing an example of the structure of a power supply device using the impedance circuit according to the present invention. In FIG. 6, the same reference symbols as those of FIG. 8 denote identical or equivalent components to those shown in FIG. 8. Descriptions thereof will be omitted herefrom. Compared with FIG. 8, FIG. 6 shows a resistor 113 in place of the resistor 103 as well as a resistor 114 in place of the resistor 104.

In this example, the resistor 114 is a resistance which a current path between a power supply section 101 and a load 102 has. The resistance value of the resistor 114 is expressed by RL1+RL2. At this time, an impedance circuit as described above is adopted as the resistor 113. The resistance value of the impedance circuit is set to a negative resistance −RL1−RL2. In this way, a voltage drop caused between the power supply section 101 and the load 102 is compensated. The potential difference between both ends of the load can accordingly be maintained constant.

Figure 7:
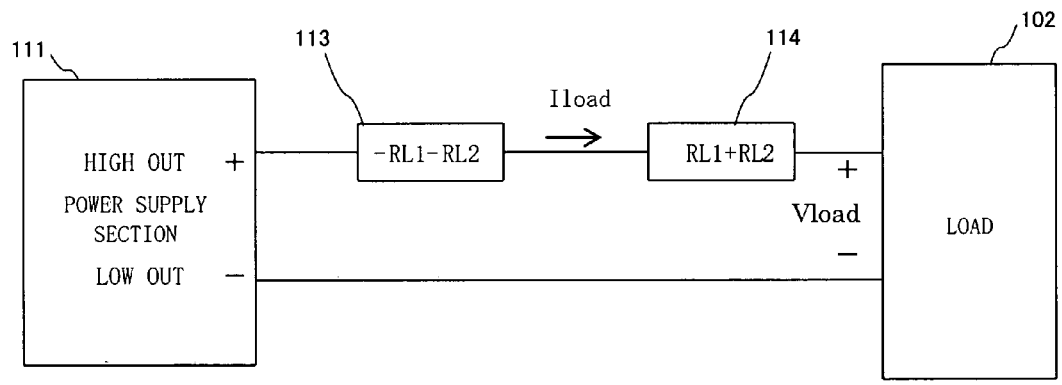
FIG. 7 is a circuit diagram showing another example of the structure of the power supply device using a negative impedance circuit according to the present invention.

Also in this case, the power supply does not always need the remote sensing function. FIG. 7 is a circuit diagram showing another example of the structure of the power supply device using an impedance circuit according to the present invention. In FIG. 7, the same reference symbols as those of FIG. 6 denote identical or equivalent components to those shown in FIG. 6. Descriptions thereof will be omitted herefrom. Compared with FIG. 6, FIG. 7 includes a power supply section 111 in place of the power supply section 101. Compared with the power supply section 101, the power supply section 111 has none of HIGH SENSE and LOW SENSE which are terminals for the remote sensing function.

According to the present embodiment, the potential difference between both ends of a load can be maintained constant by compensating for a voltage drop caused between an output terminal of a power supply and the load.

The impedance circuit according to the present invention can be easily applied to a power supply device. The performance of the power supply device can thereby be improved more. In this case, the power supply device can include a test device for a device using a battery, or the like.

First current inverter circuits correspond to current inverter circuits 11 or 13 in the above embodiments. Second current inverter circuits correspond to current inverter circuits 12 or 13 in the above embodiments.

What is claimed is:

1. An impedance circuit connected to an external circuit, comprising:
   a first current inverter circuit having an input terminal connected to outside;
   a passive circuit having an input terminal connected to an output terminal of the first current inverter circuit; and
   a second current inverter circuit having an input terminal connected to an output terminal of the passive circuit and an output terminal connected to outside, wherein
   the first and second current inverter circuits work in cooperation with each other, to make the magnitude of impedance of the impedance circuit proportional to the impedance of the passive circuit, and to invert a polarity of the impedance of the impedance circuit, and
   the first and second current inverter circuits each have one operational amplifier, two diodes connected in inverse-parallel to each other between an output terminal of the operational amplifier and a non-inverted input terminal thereof, and two diodes connected in inverse-parallel to each other between the output terminal of the operational amplifier and an inverted input terminal thereof.

2. The impedance circuit according to claim 1, wherein the second current inverter circuit has a current amplification factor which is a reciprocal of a current amplification factor of the first current inverter circuit.

3. The impedance circuit according to claim 1, wherein the first and second current inverter circuits each have one operational amplifier, a resistor connected between an output terminal of the operational amplifier and a non-inverted input terminal thereof, and a resistor connected between the output terminal of the operational amplifier and an inverted input terminal thereof.

4. A power supply device comprising:
   a power supply section that supplies direct current power supply; and
   an impedance circuit which is connected between the power supply section and an external load, has a first current inverter circuit, a passive circuit, and a second current inverter circuit, and has negative impedance that compensates for impedance of a path between the power supply section and the external load, wherein
   the first current inverter circuit has an input terminal connected to the power supply section,
   the passive circuit has an input terminal connected to an output terminal of the first current inverter circuit,
   the second current inverter circuit has an input terminal connected to an output terminal of the passive circuit, an output terminal connected to the external load, and the first and second current inverter circuits work in cooperation with each other, to make the magnitude of impedance of the impedance circuit proportional to the impedance of the passive circuit, and to invert a polarity of the impedance of the impedance circuit, and
   the first and second current inverter circuits each have one operational amplifier, two diodes connected in inverse-parallel to each other between an output terminal of the operational amplifier and a non-inverted input terminal thereof, and two diodes connected in inverse-parallel to each other between the output terminal of the operational amplifier and an inverted input terminal thereof.

5. The power supply device according to claim 4, wherein the second current inverter circuit has a current amplification factor which is a reciprocal of a current amplification factor of the first current inverter circuit.

6. The power supply device according to claim 4, wherein the first and second current inverter circuits each have one operational amplifier, a resistor connected between an output terminal of the operational amplifier and a non-inverted input terminal thereof, and a resistor connected between the output terminal of the operational amplifier and an inverted input terminal thereof.

* * * * *